United States Patent [19]

Aton

[11] Patent Number: 5,208,531
[45] Date of Patent: May 4, 1993

[54] APPARATUS AND METHOD FOR TESTING INTEGRATED CIRCUITS

[75] Inventor: Thomas J. Aton, Dallas, Tex.

[73] Assignee: Texas Instruments Incorporated, Dallas, Tex.

[21] Appl. No.: 566,658

[22] Filed: Aug. 13, 1990

[51] Int. Cl.$^5$ .................... G01R 1/00; G01R 31/02
[52] U.S. Cl. ........................... 324/158 R; 324/96; 324/158 D
[58] Field of Search ............ 324/133, 72.5, 96, 158 R, 324/158 D, 158 P

[56] References Cited

U.S. PATENT DOCUMENTS

| | | | |
|---|---|---|---|
| 3,801,910 | 4/1974 | Quinn | 324/158 D |
| 3,956,698 | 5/1976 | Malmberg et al. | 324/158 R |
| 4,573,008 | 2/1986 | Lischke | 324/158 R |
| 4,588,950 | 5/1986 | Henley | 324/158 R |
| 4,760,249 | 7/1988 | Baskett | 324/158 D |
| 4,868,492 | 9/1989 | Beha et al. | 324/158 R |
| 4,875,004 | 10/1989 | Boyd | 324/158 D |
| 4,928,058 | 5/1990 | Williamson | 324/96 |
| 4,962,353 | 10/1990 | Takahashi et al. | 324/96 |

OTHER PUBLICATIONS

J.-M. Halbout, et al., IBM Thomas J. Watson Research Center. Characterization of Logic Devices with Photo-Conductively Generated Picosecond Pulses, pp. 247-254 (1987).
Ravi Jain, Editor, SPIE vol. 795, Characterization of Very High Speed Semiconductor Devices and Integrated Circuits (1987) (for all following citations).
Gerard A. Mourou, Univ. of Rochester, Electro-Optic Sampling: Device Embodiments and Possibilities, pp. 300-309.
Brian H. Kolner, Hewlett-Packard Labs., Electro-Optic Sampling in Gallium Arsenide, pp. 310-316.
X.-C. Zhang, R. K. Jain, Amoco Research Ctr. Analysis of High Speed GaAs ICs with Electro-Optic Probes, pp. 317-338.
J. M. Wiesenfeld, et al., AT&T Bell Labs. Electro-Optic Sampling Using Injection Lasers, pp. 339-344.
Francois J. Henley, et al., Photon Dynamics Inc. Simple and Inexpensive Method for Testing High Speed Semiconductor Devices Using Electro-Optic Sampling, pp. 345-351.
K. W. Forsyth, et al., EG&G Princeton Applied Research, Simple and Inexpensive Method for Testing High Speed Semiconductor Devices Using Electro-Optic Sampling, pp. 352-356 (1987).

*Primary Examiner*—Kenneth A. Wieder
*Assistant Examiner*—William J. Burns
*Attorney, Agent, or Firm*—James C. Kesterson; B. Peter Barndt; Richard L. Donaldson

[57] ABSTRACT

An apparatus and method for testing an integrated circuit (12) generally comprises an input pad (14) and output pad (15) having photo-sensitive sensors (20, 46) formed thereon for eliminating the need to come into direct contact with a probe card for testing the integrity of an integrated circuit.

18 Claims, 1 Drawing Sheet

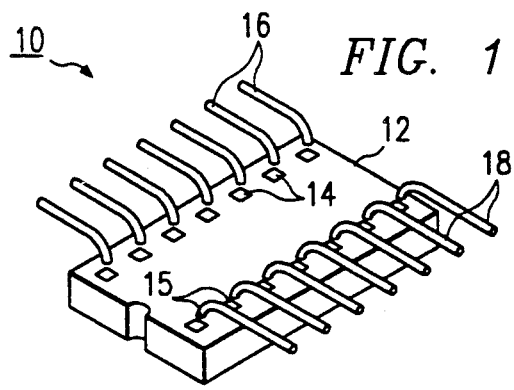
FIG. 1
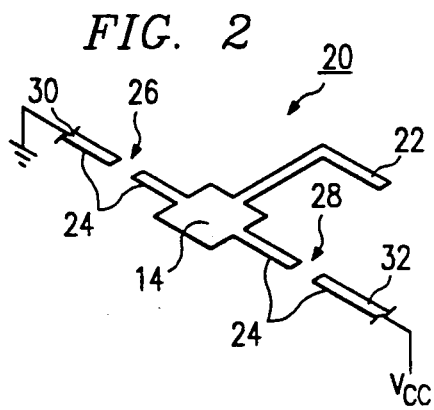
FIG. 2
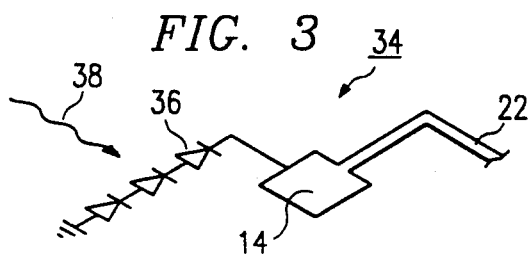
FIG. 3
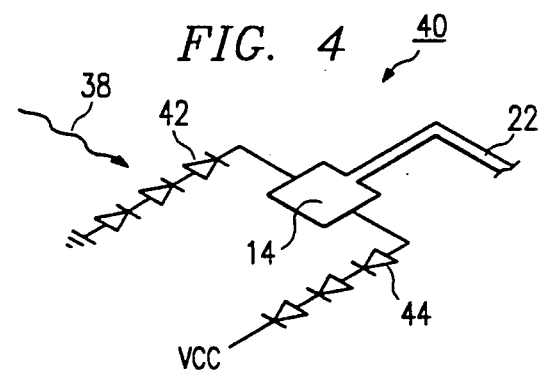
FIG. 4
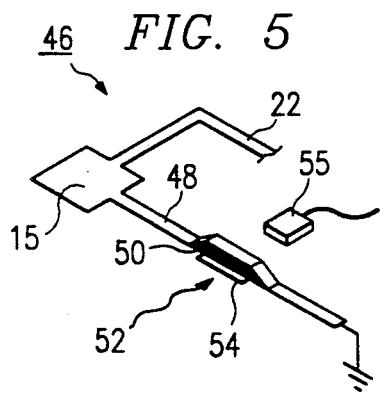
FIG. 5
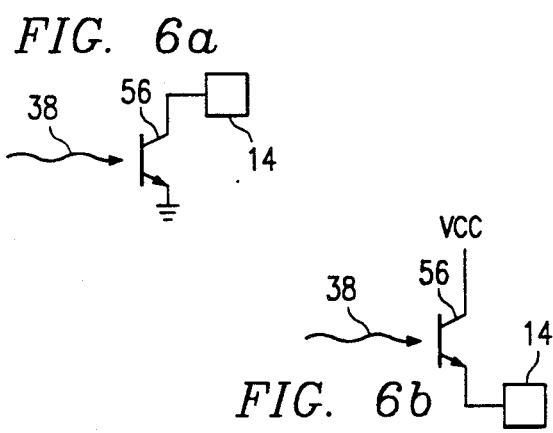
FIG. 6a
FIG. 6b
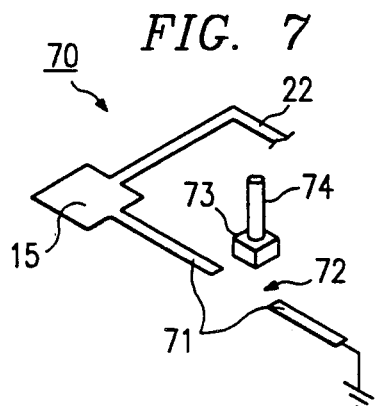
FIG. 7

APPARATUS AND METHOD FOR TESTING INTEGRATED CIRCUITS

TECHNICAL FIELD OF THE INVENTION

This invention relates in general to an integrated circuit, and more particularly to an integrated circuit having photosensitive elements contained at the input-/output pads for testing the integrity of the integrated circuit.

BACKGROUND OF THE INVENTION

In order to test the integrity of an integrated circuit, the typical integrated circuit chip is fabricated having a plurality of metal input and output pads along its periphery. From a practical standpoint, it is important to test the integrated circuit prior to use in order to insure the integrity of the chip. Generally, the dimensions of the pads are 4×4 mils and the pads will be wire bonded to connect the integrated circuit to the package.

In practice, a probe card is used for testing purposes. The probe card is generally a printed circuit board having a plurality of metal fingers extending therefrom which are designed to mate with the input and output pads on the integrated circuit to be tested. These metal fingers are brought into contact with the input and output pads in order for the probe card to send messages to and receive messages from the integrated circuit. Signals are sent through the integrated circuit to determine its integrity by controlling the input and output of the probe card signals. These signals are subsequently analyzed by a testing system to determine whether the chip is useful.

Unfortunately, when using the probe card, it is difficult to precisely align the probe card fingers with the integrated circuit pads. In the past, once the card has been used several times, it is necessary to realign the card and resharpen the points in order to have contact for proper testing of the integrated circuit. Generally, probe cards are sent to a third party vendor which specializes in realigning probe cards to insure their integrity, a process which can be costly and time-consuming.

The testing of the integrated circuit card can experience problems other than nonalignment, such as the formation of a thin oxide layer which is still present on the pad prior to testing. Unfortunately, false negative tests are experienced when there is no electrical contact between the fingers on the probe card and the integrated circuit.

Therefore, a need has arisen in the industry to provide a method and apparatus for testing integrated circuits and for eliminating the cumbersome task of aligning the probe card fingers to the input and output pads on integrated circuits.

SUMMARY OF THE INVENTION

In accordance with the present invention, an integrated circuit and a method of testing the same is provided which substantially eliminates the disadvantages associated with testing integrated circuit chips.

In its preferred embodiment, an integrated circuit is manufactured which has an input sensor and an output sensor contained thereon for testing to determine the integrity of the integrated circuit. As intended by the present invention, a photon-activated element is connected to the input sensor for detecting a photon signal from an exterior source and converting the photon signals to electronic signals. Once the electrical signals have been sent through the integrated circuit, a receiver element which is connected to the output sensor senses the electronic signal, which is subsequently transferred to a testing system for testing the integrity of the integrated circuit.

The photon-activated element generally comprises a photo-sensitive element, such as a photo-diode. In an alternative, the input sensor comprises two photodiodes, one used for high signals and the other used for low signals. The receiving element generally comprises an electro-optic element which is electrically connected to the output sensor and is capable of indicating the presence of an electronic signal. In operation, a photon beam source is sent substantially perpendicular to the electro-optic element and a photon sensor is positioned on the opposite side of the electro-optic element for sensing the change of the polarization of the photon beam for determining whether an electronic signal exists at the output sensor.

One technical advantage of this invention is that a plurality of fiber optic input and output lines can be aligned substantially adjacent to the input and output sensors without having actual contact to the pads.

Another technical advantage of the present invention is that the problem with oxide penetration for mechanical contact is eliminated by communicating the desired signals by optical sensors.

The present invention also has the technical advantages of reducing the requirements for alignment of conventional probe cards. As intended by the present invention, the input and output sensors can be operated substantially independently and, therefore, are not required to be on the same card with one another.

BRIEF DESCRIPTION OF THE DRAWINGS

For a more complete understanding of the present invention, reference is now made to the following drawings taken in conjunction with the following description, in which:

FIG. 1 illustrates an integrated circuit board having a plurality of fiber optic sources held adjacent to a plurality of input and output pads;

FIG. 2 is schematic view of an input pad having a low drive and high drive photoconductive switch extending therefrom;

FIG. 3 is a schematic view of an input pad having a photodiode extending therefrom;

FIG. 4 is a schematic view of an input pad having two photodiodes, one having a high drive and the other having a low drive associated therewith;

FIG. 5 is a schematic view of an output pad having an electro-optic element formed therein;

FIGS. 6A and 6B are schematic views of input pads having phototransistors positioned thereon for sensing light; and FIG. 7 is a perspective view of an output pad having an electro-optic element held on a fiber-optic source for sensing voltage to determine integrity of the integrated circuit.

DETAILED DESCRIPTION OF THE INVENTION

The present invention is generally an integrated circuit and a method for testing the same which has an input and an output sensor connected to the integrated circuit to permit testing the integrity of the circuit without contacting the surface of the integrated circuit. This incorporation of the input and output sensors in the input and output pads permits the elimination of metallic probe fingers which have extreme problems associated with alignment when testing.

FIG. 1 illustrates an integrated circuit of the present invention which is generally designated 10. In its preferred embodiment, an integrated circuit chip 12 has a plurality of input pads 14 and output pads 15 formed thereon which have sensors incorporated therein. In operation, a plurality of fiber optic sources 16 and 18 provide photon sources to input pads 14 and to output pads 15.

FIG. 2 is an input activated device 20 which is capable of detecting a light source or a photon beam without having direct contact with metal finger from a probe card. Device 20 generally comprises an input pad 14 having metal strips 24 extending therefrom. Additionally, a lead 22 is connected to pad 14 which subsequently transfers electronic signals to the integrated circuit. Similarly, metal strips 24 are connected to a ground 30 and a $V_{cc}$ contact 32. Formed along strips 24 is a low drive sensor 26 and a high drive sensor 28.

Device 20 as disclosed in FIG. 2, is capable of detecting light from sensors 26 and 28 and sending electronic messages to the integrated circuit through lead 22 which are translated to electronic pulses for determining the integrity of the integrated circuit.

In FIG. 3, an alternative embodiment of the present invention is seen. Device 34 is an input sensing device which has a pad 14 connected to a lead 22. In addition, a photodiode 36 is connected to pad 14 which senses a photon beam 38. As can be appreciated, pad 14 does not need a metal finger touching the pad to initiate the electronic signal through the integrated circuit.

FIG. 4 is another alternative embodiment. Device 40 generally comprises an input pad 14 having a lead 22 extending therefrom which is connected to the integrated circuit. In addition, a high drive photodiode 42 and a low drive photodiode 44 extend from input pad 14. In its operation, photon beam 38 contacts either high drive diode 42 or low drive diode 44 to send a predetermined message through the pad to the integrated circuit in order to determine whether the integrated circuit is functioning properly.

In reference to FIG. 5, an output sensor can be seen in its preferred embodiment. Generally, device 46 comprises an output pad 15 having a lead 22 extending therefrom which receives electronic signals from the integrated circuit. Output pad 15 has a metal strip 48 extending therefrom. Metal strip 48 has an electro-optic element 50 formed therein.

In operation, an optical beam 52 is sent substantially perpendicular to the surface of the electro-optic element 50 in order to determine whether an electrical impulse is being sent through metal strip 48. This sensing is done by a photo sensor 55 which is aligned on the side opposite to optical beam 52 to detect the change of polarization of optical beam 52. As can be appreciated, device 46 is designed such that optical beam 52 can detect an electronic potential on metal strip 48 without contacting the surface of strip 48. This provides increased ease of operation because the metal strips from the probe card do not have to make contact with output pad 15.

FIGS. 6A and 6B illustrate alternative input mechanisms of the present invention. As can be seen, in FIG. 6A, an input pad 14 has a phototransistor 56 extending therefrom. In operation, the photon beam 38 activates the phototransistor 56 in order for it to initiate the flow of electrons through pad 14. In an alternative embodiment, a separate phototransistor 56 can be taken to an input pad for initiating the flow of electrons from a photon beam 38 as seen in FIG. 6B.

Referring to FIG. 7, an alternative embodiment of the present invention can be seen. Generally, device 70 comprises an output pad 15 having a lead 22 connected thereto for receiving messages from the integrated circuit. As can be seen, output pad 15 has a metal strip 7i extending therefrom and has a gap 72 formed therein. In operation, a fiber optic filament 74 having an electro-optic element 73 connected thereon can be lowered in close proximity to gap 72 for detecting whether an electronic signal is being passed through metal strip 71. This is done by sending a photon source through filament 74 to element 73 and receiving a signal back from element 73 to determine whether an electronic potential is present on the source. The electro-optic elements can be, for example, gallium arsenide and lithium niobate.

The present invention features advantages over prior art in its ability to test the integrity of an integrated circuit without coming into direct contact with the input and output leads of the signal circuit.

Although this description describes the invention with reference to the above specified embodiments, it is but one example, and the claims, not this description, limit the scope of the invention. Various modifications of the disclosed embodiment, as well as alternative embodiments of the invention, will become apparent to persons skilled in the art upon reference to the above description. Therefore, the appended claims will cover such modifications that fall within the true scope of the invention.

What is claimed is:

1. An integrated circuit having photon-activated signal elements for testing the integrity of an active portion of said integrated circuit, which comprises;
   an output pad for receiving a first electrical signal from said active portion of said integrated circuit; and
   an electro-optic receiving element connected to said output pad for sensing a second electrical signal based upon said first electrical signal for testing the integrity of said integrated circuit with physical contact with an external circuit.

2. The integrated circuit as recited in claim 1, further comprising an output pad having a photon activated element connected thereto for detecting photon signals and converting said photon signals to electrical signals.

3. Circuitry for testing the integrated circuit as recited in claim 1, said circuitry comprising:
   a photon beam source for sensing photons substantially perpendicular to said electro optic element; and
   a photon sensor for sensing the polarization of said photon beam.

4. The integrated circuit as recited in claim 1, wherein said electro-optical elements comprise gallium arsenide and lithium niobate.

5. An integrated circuit having an input sensor and output sensor contained thereon which are activated by photon signals for testing the integrity of the integrated circuit, which comprises:
   a photon-activated element connected to the input sensor for detecting photon signals and converting the photon signals to first electronic signals; and an electro-optic receiving element connected to the output sensor for sensing second electron signals based on said first electronic signals for testing the integrity of the integrated circuit without physical contact to an external circuit.

6. The integrated circuit as recited in claim 5, and further comprising a testing system external of said integrated circuit to receive said electronic signals from said receiving element for analyzing said electronic signals to determine the integrity of the integrated circuit.

7. The integrated circuit as recited in claim 5, wherein said photon-activated element comprises a photodiode.

8. The integrated circuit as recited in claim 5, wherein said photon-activated element comprises:
   a first photodiode for detecting a high signal; and
   a second photodiode for detecting a low signal.

9. The integrated circuit as recited in claim 5, and further comprising external means for testing said integrated circuit, said means comprising:
   a photon beam source for sending photons substantially perpendicular to said electro-optic element; and
   a photon sensor position opposite said photon beam source for sensing the polarization of said photon beam to determine whether voltage exists at the output sensor.

10. The integrated circuit as recited in claim 5, wherein said electro-optic element comprises lithium niobate, and gallium arsenide.

11. A system for testing an integrated circuit, which comprises:
    circuitry for supplying a photon test signal;
    an input pad formed in the integrated circuit;
    a photon-activated element connected to said input pad for detecting photon signals and converting said photon signals to a first electronic signal which is supplied to said integrated circuit;
    an output pad formed in said integrated circuit for receiving a second electronic signal based upon said first electronic signal from said integrated circuit;
    an electro-optic receiving element connected to said output pad;
    circuitry for receiving said electronic signal to determine the integrity of said integrated circuit without physical contact to said integrated circuit.

12. The system as recited in claim 11, further comprising a microprocessor coupled to, said circuitry for receiving for analyzing said electronic signals for determining the integrity of the integrated circuit.

13. The system as recited in claim 12, further comprising a receiving element electrically connected to said input pad for transmitting the electronic signals to said microprocessor.

14. The system as recited in claim 11, wherein said photon-activated element comprises a photodiode.

15. The system as recited in claim 11, wherein said photon-activated element comprises;
    a first photodiode for detecting a high signal; and 16. The system as recited in claim 11, wherein said circuitry for receiving comprises:
    a photon beam source for sending a photon beam substantially perpendicular to said electro optic element; and
    a photon sensor position opposite said photon beam source for sensing the polarization of said photon beam.

17. The system as recited in claim 11, wherein said electro-optic element comprises gallium arsenide and lithium niobate.

18. A method for testing an integrated circuit comprising the steps of:
    sending a photon source to a photo-activated element contained on the integrated circuit;
    sensing said photon source at an input pad;
    converting said photon source to electrical signals;
    transmitting said electrical signals through the integrated circuit;
    detecting the presence of said electrical signal at an output pad by applying a photon beam source to said output pad without physically contacting said integrated circuit, and
    analyzing said signal to determine the integrity of the integrated circuit.

* * * * *